(12) United States Patent
Kim

(10) Patent No.: US 8,247,792 B2
(45) Date of Patent: Aug. 21, 2012

(54) LIGHT EMITTING DIODE HAVING MODULATION DOPED LAYER

(75) Inventor: Hwa Mok Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/103,631

(22) Filed: May 9, 2011

(65) Prior Publication Data

US 2011/0204326 A1 Aug. 25, 2011

Related U.S. Application Data

(63) Continuation of application No. 12/540,123, filed on Aug. 12, 2009, now Pat. No. 7,982,210.

(30) Foreign Application Priority Data

Aug. 20, 2008 (KR) .................. 10-2008-0081172
Jul. 2, 2009 (KR) .................. 10-2009-0060021

(51) Int. Cl.
*H01L 29/06* (2006.01)

(52) U.S. Cl. .............. 257/14; 257/13; 257/98; 257/101; 257/102; 257/103; 257/E33.008

(58) Field of Classification Search .............. 257/13, 257/14, 98, 101, 102, 103, E33.008
See application file for complete search history.

(56) References Cited

U.S. PATENT DOCUMENTS 7,692,182 B2 4/2010 Bergmann et al.

OTHER PUBLICATIONS

Notice of Allowance of U.S. Appl. No. 12/540,123 issued Apr. 4, 2011.

*Primary Examiner* — Tan N Tran
(74) *Attorney, Agent, or Firm* — H.C. Park & Associates, PLC

(57) ABSTRACT

A light emitting diode (LED) having a modulation doped layer. The LED comprises an n-type contact layer, a p-type contact layer and an active region of a multiple quantum well structure having an InGaN well layer. The n-type contact layer comprises a first modulation doped layer and a second modulation doped layer, each having InGaN layers doped with a high concentration of n-type impurity and low concentration of n-type impurity InGaN layers alternately laminated. The InGaN layers of the first modulation doped layer have the same composition, and the InGaN layers of the second modulation doped layer have the same composition. The second modulation doped layer is interposed between the first modulation doped layer and the active region, and an n-electrode is in contact with the first modulation doped layer. Accordingly, an increase in process time is prevented and strains induced in a multiple quantum well structure are reduced.

6 Claims, 1 Drawing Sheet

[Fig. 1]
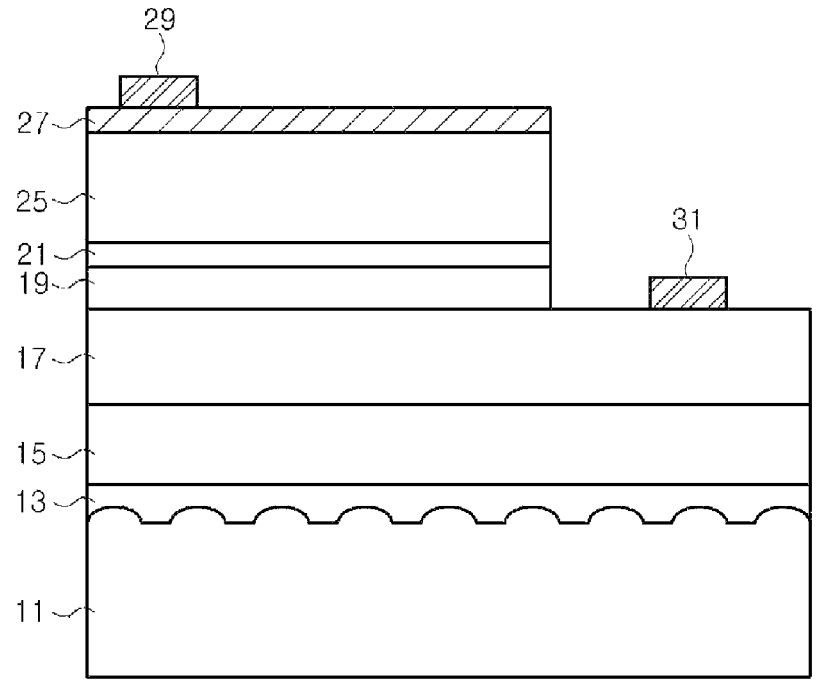
[Fig. 2]
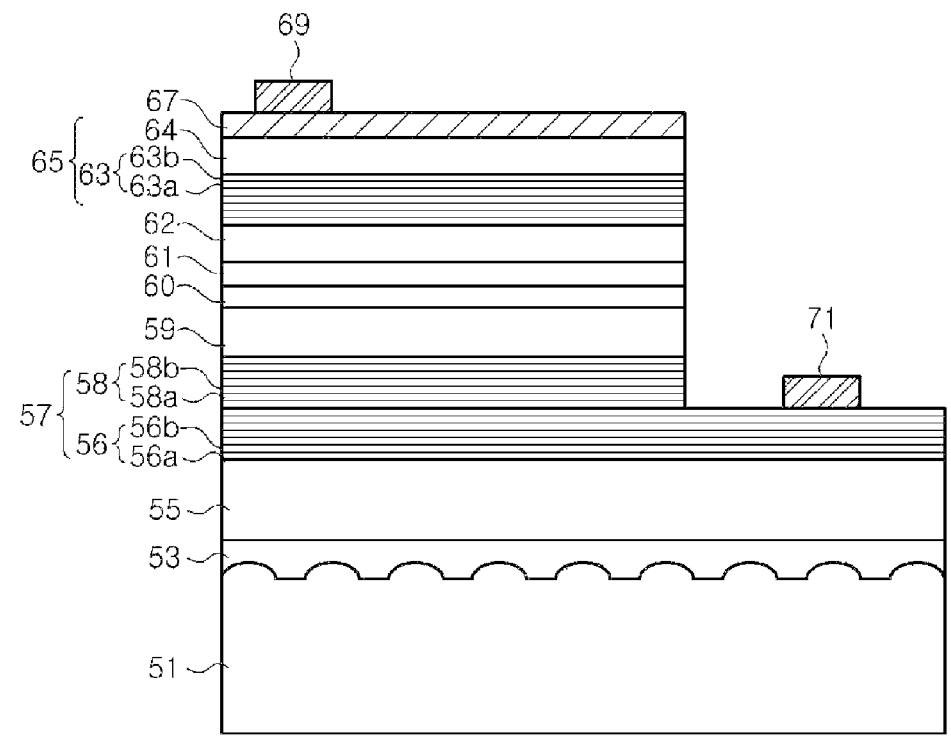

LIGHT EMITTING DIODE HAVING MODULATION DOPED LAYER

CROSS REFERENCE TO RELATED APPLICATIONS

This application is a continuation of U.S. patent application Ser. No. 12/540,123, filed on Aug. 12, 2009 and claims priority from and the benefit of Korean Patent Application No. 10-2008-0081172, filed on Aug. 20, 2008, and Korean Patent Application No. 10-2009-0060021, filed on Jul. 2, 2009, which are hereby incorporated by reference for all purposes as if fully set forth herein.

BACKGROUND OF THE INVENTION

1. Field of the Invention

The present invention relates to a light emitting diode, and more particularly, to a light emitting diode having a modulation doped layer.

2. Discussion of the Background

In general, nitride-based semiconductors are widely used for ultraviolet, blue/green light emitting diodes (LEDs) or laser diodes as light sources of full-color displays, traffic lights, general illuminators and optical communication devices. Such a nitride-based light emitting device has an active region of an InGaN-based multiple quantum well structure, which is interposed between n-type and p-type nitride semiconductor layers, and emits light through recombination of electrons and holes in the active region.

FIG. 1 is a sectional view illustrating a conventional LED.

Referring to FIG. 1, the conventional LED comprises a substrate 11, a buffer layer 13, an undoped GaN layer 15, an n-type GaN contact layer 17, an active region 19, a p-type AlGaN clad layer 21, a p-type GaN contact layer 25, a transparent electrode 27, a p-electrode 29 and an n-electrode 31.

The conventional LED has an active region 19 of a multiple quantum well structure having an InGaN well layer between the n-type and p-type contact layers 17 and 25, thereby improving light emitting efficiency. Further, light having a desired wavelength can be emitted by controlling the In content of the InGaN well layer in the multiple quantum well structure.

However, a nitride-based compound semiconductor used in the conventional LED is generally grown on the heterogeneous substrate 11 such as sapphire. In this case, there may be a large lattice constant difference between sapphire and GaN crystals, and therefore, a strong tensile stress may be generated in the GaN layer grown on the sapphire substrate. The tensile stress causes high-density crystal defects, e.g., dislocations to be generated in the GaN layer, and such dislocations are transferred to the active region 19 of the multiple quantum well structure, thereby reducing the light emitting efficiency.

Further, since a lattice mismatch of 11% exists between GaN and InN, a large strain is generated on the interface between a quantum well and a quantum barrier in the InGaN-based multiple quantum well structure. The strain induces a piezoelectric field in the quantum well, thereby resulting in the reduction of internal quantum efficiency. Particularly, since the amount of In contained in a quantum well is increased in a green LED, the internal quantum efficiency is further reduced by the piezoelectric field. In addition, the strain generated in the multiple quantum well structure is influenced by an n-type nitride semiconductor layer adjacent to an active layer. As the mismatch of lattice constants between an n-type nitride semiconductor layer, e.g., an n-type contact layer, and a quantum well layer increases, the strain induced in the active region increases.

In order to reduce the strain generated in the active region, a technique is used of forming a superlattice structure in which first and second nitride semiconductor layers having different compositions are alternately laminated between an n-type GaN contact layer and an active layer. However, when a superlattice structure having nitride semiconductor layers with different compositions is formed between an n-type contact layer and an active layer, the growth conditions of the respective layers, e.g., temperatures and gas flow rates, are different. Therefore, a process of forming the superlattice structure is complicated, and process time is increased.

A conventional LED allows current to be uniformly distributed in the p-type contact layer 25 by forming the transparent electrode 27, which may be made of indium tin oxide (ITO), on the p-type contact layer 25.

However, the current distribution using the transparent electrode 27 has a limitation due to its light transmittance and resistance. That is, as the transparent electrode 27 becomes thicker, its light transmittance rapidly decreases. When the resistance of the transparent electrode 27 is excessively low, current flows into the sides of the transparent electrode 27 and then flows out through the sides of the transparent electrode 27, so that light emitting efficiency may be reduced. On the other hand, with a thin transparent electrode 27, it is difficult to uniformly distribute current on the p-type contact layer 25. Accordingly, although current distribution performance is ensured by optimizing the thickness of the transparent electrode 27, there is a limit in optimizing current distribution due to nonuniformity in thickness of the transparent electrode 27, crystal defects in the p-type contact layer 25, and the like.

Current distribution performance in an LED is closely related to an electrostatic discharge (ESD) characteristic, a turn-on voltage, and the like. When the current distribution performance is poor, the ESD characteristic is degraded, and the turn-on voltage is reduced.

A superlattice layer may be formed on the p-side region of the LED to improve the ESD characteristic. However, since a superlattice layer having nitride semiconductor layers with different compositions is typically used, manufacturing time of the LED increases.

SUMMARY OF THE INVENTION

Exemplary embodiments of the present invention provide an LED, wherein dislocations can be prevented from being transferred into an active region while process time is prevented increasing.

Exemplary embodiments of the present invention also provide an LED, in which strains induced in a multiple quantum well structure can be reduced.

Exemplary embodiments of the present invention also provide an LED, in which an electrostatic discharge characteristic is improved and a turn-on voltage is increased without increasing process time.

Additional features of the invention will be set forth in the description which follows, and in part will be apparent from the description, or may be learned by practice of the invention.

An exemplary embodiment of the present invention discloses an LED having a modulation doped layer. The LED comprises an n-type contact layer, a p-type contact layer, and an active region of a multiple quantum well structure having an InGaN well layer and interposed between the n-type and p-type contact layers. The n-type contact layer comprises a first modulation doped layer having first InGaN layers and second InGaN layers alternately laminated. The first InGaN layers are doped with an n-type impurity and the second InGaN layers have a lower doping concentration than that of the first InGaN layers. The n-type contact layer also comprises a second modulation doped layer having third InGaN layers and fourth InGaN layers alternately laminated. The third InGaN layers are doped with an n-type impurity and the fourth InGaN layers have a lower doping concentration than that of the third InGaN layers. Further, the first InGaN layers and the second InGaN layers in the first modulation doped layer have the same composition, and the third InGaN layers and the fourth InGaN layers in the second modulation doped layer have the same composition. Furthermore, the second modulation doped layer is interposed between the first modulation doped layer and the active region, and an n-electrode is in contact with the first modulation doped layer.

The InGaN/InGaN modulation doped layers having the same composition are used as an n-type contact layer, so that it is possible to prevent process time of manufacturing an LED from increasing and dislocations from transferring into the multiple quantum well structure through the modulation doped layers. Further, the InGaN/InGaN modulation doped layers are used so that strains induced in the active region can be reduced as compared with a case where a GaN layer is used as a contact layer. Furthermore, the crystallinity of a quantum well layer is improved, thereby increasing the recombination rate of carriers.

The second InGaN layers having a lower doping concentration than that of the first InGaN layers may be undoped layers. The fourth InGaN layers having a lower doping concentration than that of the third InGaN layers may be undoped layers.

An In composition ratio in the first modulation doped layer may be smaller than that of the second modulation doped layer. The second modulation doped layer having a greater In composition ratio is formed on the first modulation doped layer having a smaller In composition ratio, so that the In composition ratio can be gradually increased. Accordingly, it is possible to reduce strains caused by the difference in lattice constant between the n-type contact layer and the active region.

One of the third InGaN layers doped with the n-type impurity in the second modulation doped layer may be adjacent to the active region. Accordingly, electrons can be efficiently injected into the active region from the modulation doped layer.

Preferably, the second modulation doped layer has a smaller In composition ratio than the InGaN well layer. Accordingly, carriers can be trapped in the active region, thereby increasing the recombination rate of electrons and holes.

The LED may further comprise a substrate and a buffer layer interposed between the substrate and the n-type contact layer. The substrate may be a sapphire substrate, and the buffer layer may be a GaN buffer layer.

The p-type contact layer may comprise a first p-type GaN layer, a second p-type GaN layer and a third modulation doped layer interposed between the first and second p-type GaN layers. The third modulation doped layer has fifth InGaN layers and sixth InGaN layers alternately laminated, wherein the fifth InGaN layers are doped with a p-type impurity and the sixth InGaN layers have a lower doping concentration than that of the fifth InGaN layers; and the fifth InGaN layers and sixth InGaN layers have the same composition. Accordingly, current distribution can be promoted in the p-type contact layer, thereby improving ESD and turn-on voltage characteristics of the LED.

The sixth InGaN layers having a lower doping concentration than that of the fifth InGaN layers may be undoped layers.

The second p-type GaN layer may have the same doping concentration as the first p-type GaN layer. The fifth InGaN layers doped with the p-type impurity in the third modulation doped layer may have a different doping concentration from those of the first and second p-type GaN layers. Particularly, the fifth InGaN layers may have a lower doping concentration than those of first and second p-type GaN layers.

The LED may further comprise a p-type AlGaN clad layer interposed between the active region and the p-type contact layer. The p-type AlGaN clad layer prevents overflow of electrons, thereby increasing the recombination rate of electrons and holes.

The LED may further comprise a superlattice layer interposed between the active region and the p-type AlGaN clad layer, wherein the superlattice layer includes InGaN layers doped with a p-type impurity and AlGaN layers doped with a p-type impurity alternately laminated. The superlattice layer is used to reduce lattice mismatch between the multiple quantum well structure and the p-type AlGaN clad layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 1 is a sectional view illustrating a conventional LED.

FIG. 2 is a sectional view illustrating an LED according to an exemplary embodiment of the present invention.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

FIG. 2 is a sectional view illustrating an LED according to an exemplary embodiment of the present invention.

Referring to FIG. 2, the LED comprises an n-type contact layer 57, an active region 59 of a multiple quantum well structure and a p-type contact layer 65. The LED may further comprise a substrate 51 and a buffer layer 55 interposed between the substrate 51 and the n-type contact layer 57. A nucleus layer 53 may be interposed between the substrate 51 and the buffer layer 55. A p-type AlGaN clad layer 61 may be interposed between the active region 59 and the p-type contact layer 65, and an InGaN/AlGaN superlattice layer 60 may be interposed between the p-type AlGaN clad layer 61 and the active region 59. In addition, a transparent electrode 67 and a p-electrode 69 may be formed on the p-type contact layer 65, and an n-electrode 71 may be formed on the n-type contact layer 57.

The substrate 51 is a substrate for growing GaN-based semiconductor layers thereon, and includes, but is not particularly limited to, sapphire, SiC, spinel and the like. Preferably, the substrate 51 may be a patterned sapphire substrate (PSS) as shown in this figure.

The nucleus layer 53 may be formed of (Al, Ga)N, preferably GaN, at a low temperature of 400 to 600° C. so as to grow the GaN buffer layer 55 on the substrate 51. The nucleus layer 53 may be formed to have a thickness of about 25 nm. The GaN buffer layer 55 is formed to reduce lattice mismatch between the substrate 51 and the n-type contact layer 57 and grown at a relatively high temperature. The GaN buffer layer 55 may be formed of undoped GaN or GaN doped with an n-type impurity such as Si or Ge.

The n-type contact layer 57 comprises a first modulation doped layer 56 and a second modulation doped layer 58. The first modulation doped layer 56 has InGaN layers 56a doped with an n-type impurity and InGaN layers 56b having a lower doping concentration than that of the InGaN layers 56a, alternately laminated. The InGaN layers 56b may be undoped. The second modulation doped layer 58 has InGaN layers 58a doped with an n-type impurity and InGaN layers 58b having a lower doping concentration than that of the InGaN layers 58a, alternately laminated. The InGaN layers 58b may be undoped. Here, the InGaN layers 56a and 56b of the first modulation doped layer 56 have the same composition, and the InGaN layers 58a and 58b of the second modulation doped layer 58 have the same composition. That is, each of the first and second modulation doped layers 56 and 58 is formed of InGaN layers having the same composition except different impurity doping concentrations. Accordingly, each of the first and second modulation doped layers 56 and 58 may be formed by controlling the supply amount of an impurity source, e.g., by repeating the supply and interception of an impurity source.

The second modulation doped layer 58 is interposed between the first modulation doped layer 56 and the active region 59. An In composition ratio in the first modulation doped layer 56 is different from that in the second modulation doped layer 58. Preferably, the In composition ratio in the first modulation doped layer 56 is smaller than that in the second modulation doped layer 58. Accordingly, the In composition ratio in the n-type contact layer 57 can be gradually increased, so that the lattice mismatch between the n-type contact layer 57 and the active region 59 can be reduced.

The impurity, with which the InGaN layers in the first and second modulation doped layers 56 and 58 are doped, may be various, including Si, Ge and the like. Preferably, Si may be used as the impurity. Si, with which the first and second modulation doped layers 56 and 58 are doped, prevents dislocations induced in their lower layers from being transferred to their upper layers, thereby improving crystallinity in the active region 59.

The InGaN layers in each of the first and second modulation doped layers 56 and 58 may be formed by 7 to 15 periods. The effect of using modulation doped layers is slight when the InGaN layers in the first or second modulation doped layer 56 or 58 are formed by below 7 periods while process time is increased when the InGaN layers in the first or second modulation doped layer 56 or 58 are formed by over 15 periods, which is not preferable.

As shown in this figure, the first and second modulation doped layers 56 and 58 may come into contact with each other. However, the present invention is not limited thereto. That is, a GaN-based semiconductor layer having a different composition from those of the first and second modulation doped layers may be interposed therebetween.

The active region 59 has a multiple quantum well structure in which quantum barrier layers and InGaN quantum well layers are alternately laminated. The quantum barrier layer may be formed of a GaN-based semiconductor layer, e.g., GaN, InGaN, AlGaN or AlInGaN, having a wider bandgap than that of the quantum well layer. The In composition ratio in the InGaN quantum well layer is determined by a desired optical wavelength. Preferably, the In composition ratio in the InGaN layer of the second modulation doped layer 58 is smaller than that of the InGaN quantum well layer such that electrons and holes can be trapped in the InGaN quantum well layer.

The p-type clad layer 61 may be formed of AlGaN and allows a recombination rate of electrons and holes in the active region 59 to be improved by preventing overflow of electrons. Since the p-type AlGaN clad layer 61 has a relatively low lattice constant, the lattice mismatch between the active region 59 having the multiple quantum well structure and the clad layer 61 is increased, and therefore, the crystallinity of the AlGaN clad layer 61 may be deteriorated. Accordingly, before the AlGaN clad layer 61 is formed, the InGaN/AlGaN superlattice layer 60 may be formed. The superlattice layer 60 serves as a buffer layer for the p-type AlGaN clad layer 61.

The p-type contact layer 65 comprises a first p-type GaN layer 62, a third modulation doped layer 63 and a second p-type GaN layer 64. The first and second p-type GaN layers 62 and 64 may be grown at a temperature of about 950° C. using a metal organic chemical vapor deposition (MOCVD) technique and doped with a p-type impurity, e.g., Mg at a concentration of about $5 \times 10^{18}$ cm$^{-3}$. Preferably, the first and second p-type GaN layers 62 and 64 have the same doping concentration so as to perform a stable process.

In the third modulation doped layer 63, InGaN layers 63a doped with a p-type impurity and InGaN layers 63b having a lower doping concentration than that of the InGaN layer 63a, are alternately laminated. The InGaN layers 63b may be undoped. For example, the InGaN layers 63a and 63b in the third modulation doped layer 63 may be grown by 7 to 15 periods. The InGaN layers 63a may be doped with Mg at a concentration of about $1 \times 10^{17}$-$1 \times 10^{18}$ cm$^{-3}$, which is lower than that of the first and second p-type GaN layers 62 and 64. These InGaN layers 63a and 63b are formed to have the same composition except for doping or not with an impurity. Accordingly, the third modulation doped layer 63 may be continuously grown at the same temperature by repeating the supply and interception of a source gas of a p-type impurity, e.g., bis(cyclopentadienyl)magnesium (Cp$_2$Mg).

Since the doped InGaN layer 63a and the undoped InGaN layer 63b are repeatedly laminated in the third modulation doped layer 63, current can be easily distributed in the InGaN layer 63a. As a result, current can be uniformly distributed in the p-type contact layer 65. Further, the crystallinity of the second p-type GaN layer 64 can be improved by the third modulation doped layer 63.

The transparent electrode 67, which may be made of Ni/Au or indium tin oxide (ITO), is formed on the p-type contact layer 65, and the p-electrode 69 may be formed on the transparent electrode 67 using a lift-off process, for example. The n-electrode 71, which may be made of Ni/Au or Ti/Al, may also be formed on the n-type contact layer 57 by a lift-off process. For current distribution, the n-electrode 71 is preferably formed on the first modulation doped layer 56, as shown in FIG. 2.

Although in this embodiment, the LED has been described in which the p-electrode 69 and the n-electrode 71 are formed on top of the substrate 51, the present invention is not limited thereto. For example, the LED according to the present invention may be a vertical LED, in which electrodes are respectively formed on top and bottom surfaces of an LED through the process of separating the substrate 51 by a laser lift-off process.

In order to examine the effect of the third modulation doped layer 63, LEDs of present example and comparative example were manufactured to have the same structure except for application or not of the third modulation doped layer 63. That is, an LED (Present Example) was manufactured by growing the first p-type GaN layer 62, the Mg-doped InGaN layers and the undoped InGaN layers, and the second p-type GaN layer 64 and then forming an ITO transparent electrode 67. The first p-type GaN layer 62 doped with Mg at a concentration of $5 \times 10^{18}$ cm$^{-3}$ was formed to have a thickness of 50 nm. The Mg-doped and undoped InGaN layers each having a thickness of 22 Å were formed in 10 periods to have a total thickness of 22 nm. The second p-type GaN layer 64 doped with Mg at a concentration of $5 \times 10^{18}$ cm$^{-3}$ was formed to have a thickness of 128 nm. As a comparative example, an LED (Comparative Example) was manufactured by growing a single p-GaN contact layer to have a thickness of 200 nm and then is forming an ITO transparent electrode 67 without the third modulation doped layer 63.

Characteristics of the LEDs according to Present Example and Comparative Example are shown in Table 1.

TABLE 1

| | Wavelength (@ 20 mA) (nm) | Vf (@ 1 µA) (V) | Vf (@ 20 mA) (V) | Po (@ 20 mA) (mW) | Po (@ 80 mA) (mW) | Remark |
|---|---|---|---|---|---|---|
| Comparative Example | 454.40 | 1.74 | 3.13 | 16.19 | 52.05 | Single p-type GaN contact layer |
| | 453.17 | 1.86 | 3.13 | 16.03 | 51.57 | |
| Present Example | 449.15 | 2.23 | 2.92 | 17.18 | 54.75 | Mg—InGaN/u-InGaN modulation doped layer |
| | 448.41 | 2.22 | 2.91 | 17.19 | 54.89 | |

As can be seen in Table 1, when the Mg—InGaN/u-InGaN modulation doped layer 63 is formed in the p-type contact layer 65, a voltage at 1 µA, i.e., a turn-on voltage, increases, a voltage at 20 mA, i.e., a forward voltage, decreases, and an optical output power (Po) is improved at 20 mA and at 80 mA. This may be the reason that current distribution performance is improved by the modulation doped layer 63.

According to exemplary embodiments of the present invention, an InGaN/InGaN modulation doped layer is used, so that it is possible to reduce strains in a multiple quantum well structure and to prevent dislocations from being transferred into the multiple quantum well structure through an n-type contact layer. Further, since a modulation doped layer is formed using InGaN layers having the same composition except an impurity, the InGaN layers in the modulation doped layer can be grown at the same temperature, thereby preventing an increase in manufacturing time. Furthermore, first and second modulation doped layers have different compositions from each other, so that the In composition ratio in an n-type contact layer can be gradually increased. Accordingly, the lattice mismatch between the n-type contact layer and a quantum well layer can be reduced. In addition, an InGaN/InGaN modulation doped layer is formed in a p-type contact layer, so that current distribution can be promoted in the p-type contact layer, which makes it possible to improve ESD and turn-on voltage characteristics of an LED.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light-emitting diode (LED), comprising:
an n-type contact layer;
a p-type contact layer; and
an active region of a multiple quantum well structure comprising an InGaN well layer and being interposed between the n-type contact layer and the p-type contact layer,
wherein the n-type contact layer comprises a first modulation doped layer comprising a first nitride-based semiconductor layer and a second nitride-based semiconductor layer, the first nitride-based semiconductor layer being doped with an n-type impurity, the second nitride-based semiconductor layer comprising a lower doping concentration than that of the first nitride-based semiconductor layer, and a second modulation doped layer comprising a third nitride-based semiconductor layer and a fourth nitride-based semiconductor layer, the third nitride-based semiconductor layer being doped with an n-type impurity, the fourth nitride-based semiconductor layer comprising a lower doping concentration than that of the third nitride-based semiconductor layer,
wherein the first modulation doped layer and the second modulation doped layer comprise In, respectively, and
wherein an amount of In in the first modulation doped layer is different from an amount of In in the second modulation doped layer.

2. The LED of claim 1, wherein the amount of In in the first modulation doped layer is less than the amount of In in the second modulation doped layer.

3. The LED of claim 1, wherein the second modulation doped layer is interposed between the first modulation doped layer and the active region.

4. The LED of claim 1, further comprising:
an n-electrode contacting the first modulation doped layer.

5. The LED of claim 1, wherein the second modulation doped layer comprises an InGaN layer, the InGaN layer comprising an In composition ratio less than an In composition ratio of the InGaN well layer.

6. The LED of claim 1, wherein the first nitride-based semiconductor layer and the second nitride-based semiconductor layer comprise the same composition, and the third nitride-based semiconductor layer and the fourth nitride-based semiconductor layer comprise the same composition.

* * * * *